(12) United States Patent
Iwami et al.

(10) Patent No.: US 10,396,544 B2
(45) Date of Patent: Aug. 27, 2019

(54) SHUTOFF DEVICE

(71) Applicant: Panasonic Intellectual Property Management Co., Ltd., Osaka (JP)

(72) Inventors: Eiji Iwami, Osaka (JP); Tsuyoshi Ikushima, Nara (JP); Naoki Fukuo, Mie (JP); Tomokazu Nishigaki, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 52 days.

(21) Appl. No.: 15/563,934

(22) PCT Filed: Mar. 25, 2016

(86) PCT No.: PCT/JP2016/001734
§ 371 (c)(1),
(2) Date: Oct. 2, 2017

(87) PCT Pub. No.: WO2016/170731
PCT Pub. Date: Oct. 27, 2016

(65) Prior Publication Data
US 2018/0131173 A1 May 10, 2018

(30) Foreign Application Priority Data

Apr. 22, 2015 (JP) ................. 2015-087808

(51) Int. Cl.
*G01R 15/18* (2006.01)
*H02H 3/16* (2006.01)
*G01R 19/165* (2006.01)
(Continued)

(52) U.S. Cl.
CPC ............. *H02H 3/16* (2013.01); *G01R 15/183* (2013.01); *G01R 19/16571* (2013.01);
(Continued)

(58) Field of Classification Search
CPC ........ G01R 19/16571; G01R 19/16576; G01R 19/20; G01R 31/025; G01R 31/14;
(Continued)

(56) References Cited

U.S. PATENT DOCUMENTS 4,280,162 A * 7/1981 Tanka ................. H02H 3/332
324/117 R
4,685,022 A * 8/1987 Nichols, III ............ H02H 3/33
361/42
(Continued)

FOREIGN PATENT DOCUMENTS

JP S61-15519 A 1/1986
JP H09-84254 A 3/1997
(Continued)

OTHER PUBLICATIONS

International Search Report and Written Opinion for International Application No. PCT/JP2016/001734, dated Jun. 7, 2016.
(Continued)

*Primary Examiner* — Thang X Le
(74) *Attorney, Agent, or Firm* — Renner, Otto, Boisselle & Sklar, LLP

(57) ABSTRACT

A magnetic core is electromagnetically coupled to two conductors that allow an AC current to flow through. An exciter is configured to supply a winding with an excitation current that is an alternating current. A current detector is configured to detect a current flowing through the winding. A DC component detector is configured to detect a DC component level from the current detected with the current detector. Two contact elements are respectively disposed along the two conductors. A discrimination controller is configured to: turn the two contact elements on when the DC component level detected with the DC component detector is less than or equal to a threshold; turn the two contact elements off when the DC component level detected with the (Continued)

DC component detector is greater than the threshold; and turn the two contact elements off in de-energized condition.

20 Claims, 4 Drawing Sheets

(51) Int. Cl.
  *G01R 19/20* (2006.01)
  *G01R 31/02* (2006.01)
  *H02H 3/00* (2006.01)
  *H02H 3/33* (2006.01)
  *G01R 15/04* (2006.01)

(52) U.S. Cl.
  CPC ....... *G01R 19/16576* (2013.01); *G01R 19/20* (2013.01); *G01R 31/025* (2013.01); *H02H 3/006* (2013.01); *H02H 3/332* (2013.01); *G01R 15/04* (2013.01)

(58) Field of Classification Search
  CPC .. G01R 31/3277; G01R 15/18; G01R 15/183; G01R 15/148; G01R 15/04; H02H 3/322; H02H 3/32; H02H 3/33; H02H 3/331; H02H 3/335; H02H 3/16; H02H 3/162; H02H 3/006
  See application file for complete search history.

(56) References Cited

U.S. PATENT DOCUMENTS

| | | | | |
|---|---|---|---|---|
| 5,488,303 A | * | 1/1996 | Bagalini | H02H 3/334 324/509 |
| 5,825,599 A | * | 10/1998 | Rosenbaum | H02H 3/04 361/45 |
| 6,157,165 A | * | 12/2000 | Kinoshita | H02J 7/0019 320/116 |
| 2005/0030005 A1 | | 2/2005 | Tsubota et al. | |
| 2006/0187594 A1 | * | 8/2006 | DiSalvo | H02H 3/332 361/42 |
| 2007/0063797 A1 | | 3/2007 | Houbre et al. | |
| 2008/0239596 A1 | * | 10/2008 | Restrepo | H02H 3/335 361/42 |
| 2010/0194354 A1 | * | 8/2010 | Gotou | B60L 53/30 320/163 |

FOREIGN PATENT DOCUMENTS

| | | |
|---|---|---|
| JP | H09-243697 A | 9/1997 |
| JP | 2000-23370 A | 1/2000 |
| JP | 2005-065382 A | 3/2005 |
| JP | 2006-014515 A | 1/2006 |
| JP | 2012-182920 A | 9/2012 |
| JP | 2012-225664 A | 11/2012 |
| JP | 2013-005707 A | 1/2013 |
| JP | 2013-038047 A | 2/2013 |
| WO | WO 2005/101605 A1 | 10/2005 |

OTHER PUBLICATIONS

International Extended European Search Report for Application No. 16782759.1, dated Mar. 28, 2018.

* cited by examiner

SHUTOFF DEVICE

TECHNICAL FIELD

The invention relates to shutoff devices and, more particularly, to a shutoff device configured to interrupt power supply.

BACKGROUND ART

A conventional photovoltaic system has been provided with photovoltaic cells, a dispersed power supply and a ground fault detector circuit (for example, see Patent Literature 1). The dispersed power supply is configured to convert DC voltage of the photovoltaic cells into AC voltage. The ground fault detector circuit is configured to detect a ground fault in direct current paths connecting the photovoltaic cells and the dispersed power supply.

The ground fault detector circuit includes a zero-phase-sequence current transformer having a detection core through which the direct current paths are threaded, and is configured to detect a ground fault current flowing from an output of a secondary winding wrapped around the detection core through the secondary winding.

With the ground fault detector circuit, there is a possibility that the detection core will be magnetized by a DC current flowing through the direct current paths because the detection core is arranged to be electromagnetically coupled to the direct current paths. The detection core being magnetized may make current detection precision worse.

CITATION LIST

Patent Literature

Patent Literature 1: JP 2000-23370 A

SUMMARY OF INVENTION

It is an object of the present invention to provide a shutoff device capable of suppressing reduction in detection precision of a DC current.

A shutoff device according to an aspect of the present invention includes a magnetic core, a winding, an exciter, a current detector, a DC component detector, two contact elements and a discrimination controller. The magnetic core is electromagnetically coupled to two conductors that allow an AC current to flow through. The winding is wrapped around the magnetic core. The exciter is configured to supply the winding with an excitation current that is an alternating current. The current detector is configured to detect a current flowing through the winding. The DC component detector is configured to detect a DC component level from the current detected with the current detector. The two contact elements are respectively disposed along the two conductors. The discrimination controller is configured to turn the two contact elements on when the DC component level detected with the DC component detector is less than or equal to a threshold. The discrimination controller is configured to turn the two contact elements off when the DC component level detected with the DC component detector is greater than the threshold. The discrimination controller is configured to turn the two contact elements off in de-energized condition.

DESCRIPTION OF EMBODIMENTS

Embodiments 1 to 3 to be explained below are merely examples in accordance with embodiments of the present invention. The embodiments of the present invention are not limited to the following Embodiments 1 to 3, but in Embodiments 1 to 3, various modifications may be made according to design and the like as long as the object of the present invention can be attained.

Embodiment 1

A shutoff device according to the present embodiment is provided for a charge control device called CCID (Charging Circuit Interrupt Device). The charge control device is provided in a charging cable configured to connect an AC power supply and an electric drive vehicle. Examples of the electric drive vehicle include a hybrid electric vehicle (HEV), a plug-in hybrid electric vehicle (PHEV), an electric vehicle (EV) and the like. The charge control device is configured to interrupt power supply to the electric drive vehicle when detecting a residual current that is a direct current. Note that the application of the shutoff device is not limited to the charge control device, but the shutoff device may also be applied to a charging system. The charging system is system configured to convert AC power from an AC power supply into DC power to charge a storage battery.

Figure 1:
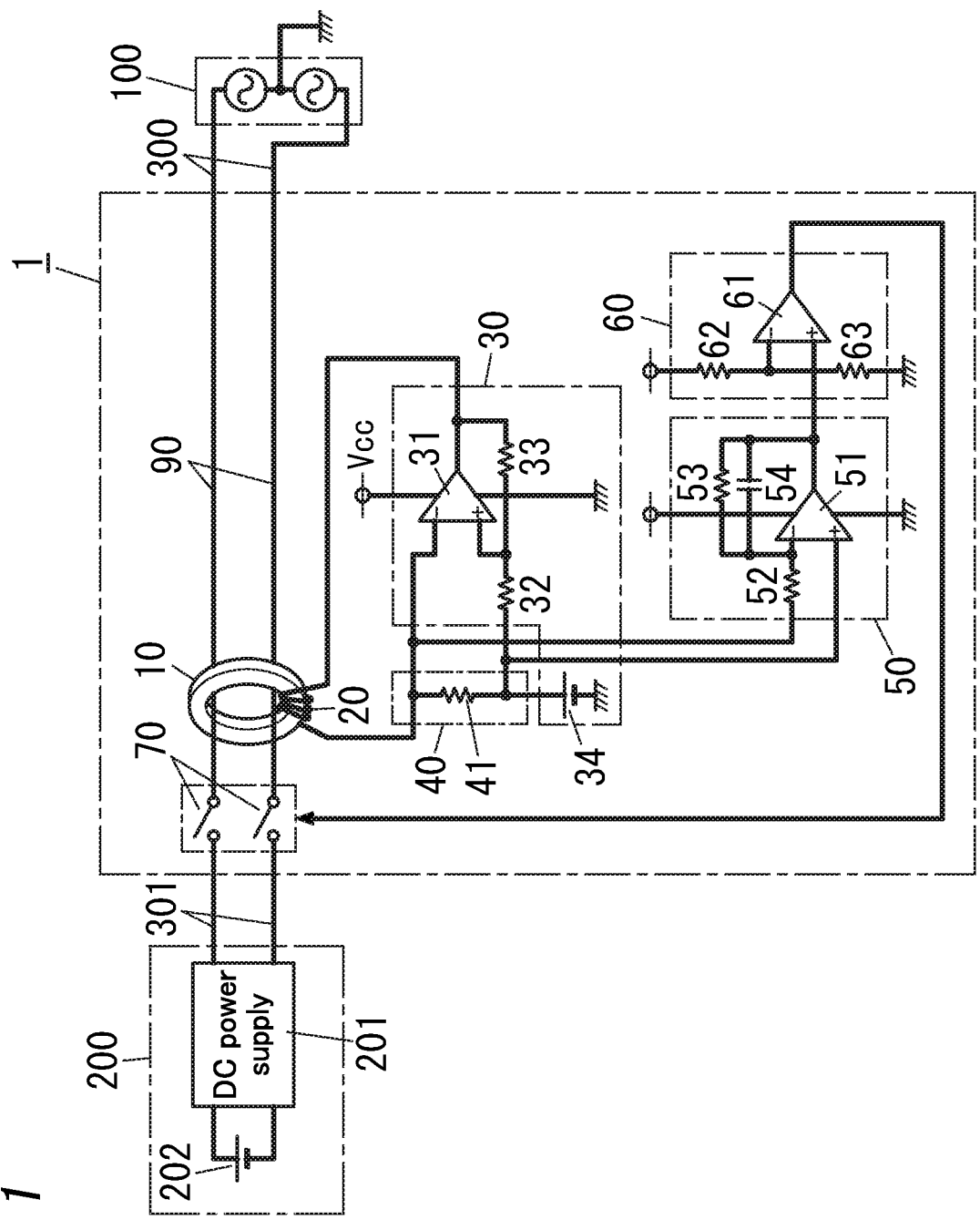
FIG. 1 is a circuit diagram of a shutoff device according to Embodiment 1.

FIG. 1 is a circuit diagram of the shutoff device 1 with which the charge control device is equipped. The shutoff device 1 is housed in a case of the charge control device. The shutoff device 1 in the charge control device is configured to be connected to the AC power supply 100 such as a commercial power supply through a two conductor power cable 300. The shutoff device 1 is also configured to be connected to the electric drive vehicle 200 through a two conductor power cable 301. The two conductor power cable 300 is electrically connected to the two conductor power cable 301 through conductors 90 housed within the case of the charge control device. That is, the conductors 90 and the power cables 300 and 301 allow an AC current from the AC power supply 100 to flow through. Herein, the shutoff device 1, the case that houses the shutoff device 1, the conductors 90, the power cables 300 and 301 and the like constitute the charge control device. Here, two conductors between the AC power supply 100 and a DC power supply 201 are composed of the two conductors 90, the two conductor power cable 300 and the two conductor power cable 301. The electric drive vehicle 200 includes the DC power supply 201 and a battery 202. The DC power supply 201 is configured to convert AC power from the AC power supply 100 into DC power. The battery 202 is configured to be charged by the DC power from the DC power supply 201.

The shutoff device 1 in the present embodiment will hereinafter be explained.

The shutoff device 1 includes a magnetic core 10, a winding 20, an exciter 30, a current detector 40, a DC component detector 50, a discrimination controller 60 and two contact elements 70.

The magnetic core 10 is electromagnetically coupled to the two conductors (especially, two conductors 90). In the present embodiment, the magnetic core 10 is in the shape of a circular ring and made of soft magnetic materials and has a hole allows the two conductors 90 to be threaded through. Preferable examples of the soft magnetic materials for forming the magnetic core 10 include nano liquid crystal materials, amorphous metal materials (amorphous ribbon, amorphous wire and the like), ferrite, permalloy, magnetic fluid and the like.

The winding 20 is wrapped around the magnetic core 10. A first end of the winding 20 is connected to an output end of the exciter 30. A second end of the winding 20 is connected to a constant power supply 34 through a resistor 41. A current flows through the two conductors 90, and then magnetic flux generated around each conductor 90 flows in the magnetic core 10, thereby inducing a current in the winding 20 according to the magnetic flux.

The exciter 30 is a positive feedback oscillator with an op-amp (operational amplifier) 31, resistors 32 and 33, and the constant power supply 34.

The op-amp 31 is a single power supply op-amp. The constant power supply 34 is configured to provide DC voltage, a voltage value of which is about half of power supply voltage Vcc to the op-amp 31. An inverted input terminal of the op-amp 31 is connected to a junction between the winding 20 and the resistor 41. Output voltage of the current detector 40 (voltage at junction between winding 20 and resistor 41) is to be supplied to the inverted input terminal of the op-amp 31. A non-inverted input terminal of the op-amp 31 is to be supplied with voltage from the resistor 41.

The current detector 40 includes the resistor 41. The resistor 41 is connected between the second end of the winding 20 and the constant power supply 34.

Since the exciter 30 is the positive feedback oscillator, the exciter 30 is configured to oscillate and supply the winding 20 with an excitation current that is an alternating current. The current detector 40 is configured to provide the exciter 30 and the DC component detector 50 with voltage obtained by adding voltage across the resistor 41 to DC voltage from the constant power supply 34.

The DC component detector 50 is, for example a low pass filter. Specifically, the DC component detector 50 is composed of an op-amp 51, resistors 52 and 53, and a capacitor 54. The DC component detector 50 is configured to attenuate high frequency components contained in output voltage of the current detector 40, thereby providing the discrimination controller 60 with DC components contained in the output voltage of the current detector 40. Here, the output voltage from the DC component detector 50 has a voltage value that is proportionate to a level of a residual current, which is a direct current, flowing through the conductors 90.

The discrimination controller 60 includes a comparator circuit with a comparator 61 and resistors 62 and 63. A positive input terminal of the comparator 61 is to be provided with the output voltage of the DC component detector 50. A negative input terminal of the comparator 61 is to be provided with reference voltage. The reference voltage is produced by dividing the constant power supply voltage Vcc by the resistors 62 and 63, and a level of the reference voltage is a threshold. The discrimination controller 60 is configured to provide the two contact elements 70 with a charge disable signal when the output voltage of the DC component detector 50 is greater than the threshold. The charge disable signal is a signal forcing the two contact elements 70 off. In de-energized condition when the electric drive vehicle 200 is disconnected from the AC power supply 100, the positive input terminal of the comparator 61 is provided with voltage greater than the reference voltage according to, for example a signal from the electric drive vehicle 200 (signal indicating de-energized condition). Accordingly, the discrimination controller 60 provides the two contact elements 70 with the charge disable signal, thereby turning the two contact elements 70 off. Note that the discrimination controller 60 may include an output circuit in addition to the comparator circuit. The output circuit is configured to control turning on and off of the two contact elements 70 according to an output signal of the comparator circuit and the signal from the electric drive vehicle 200. The output circuit turns the two contact elements 70 off in de-energized condition. The output circuit turns the two contact elements 70 on in a state without the charge disable signal, and turns the two contact elements 70 off in a state with the charge disable signal. However, the discrimination controller 60 may include only the comparator circuit, and therefore the output circuit is not indispensable thereto.

The shutoff device 1 includes the two contact elements 70. The two conductors 90 are provided with the two contact elements 70 one each. The two contact elements 70 are, for example contacts of an electromagnetic relay. The two contact elements 70 turn off when receiving the charge disable signal from the discrimination controller 60, thereby interrupting power supply from the AC power supply 100 to the DC power supply 201.

An operation of the shutoff device 1 according to the embodiment will be hereinafter explained.

Figure 2:
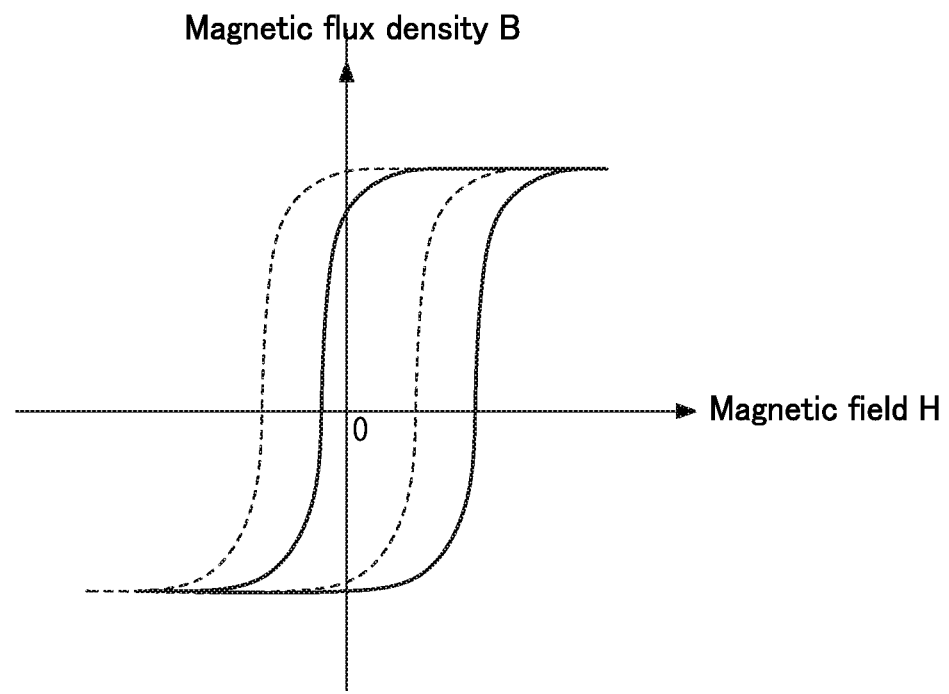
FIG. 2 illustrates B-H properties of a magnetic core in the shutoff device according to Embodiment 1.

The exciter 30 supplies the winding 20 with an excitation current that is an alternating current, thereby generating magnetic flux (magnetic field) in the magnetic core 10. Direction and strength of the magnetic flux vary according to the excitation current supplied to the winding 20 from the exciter 30. When no current flows through the two conductors 90, magnetizing properties (B-H properties) of the magnetic core 10 are magnetizing properties showing point symmetry with respect to the origin as shown in the dashed line of FIG. 2 because the magnetic flux generated in the magnetic core 10 is only magnetic flux caused by the excitation current supplied to the winding 20 from the exciter 30.

A flux gate type of magnetic flux detection method is applied to the shutoff device 1 according to the embodiment. The shutoff device 1 magnetically saturates the magnetic core 10, thereby suddenly changing the excitation current supplied to the winding 20. The shutoff device 1 detects DC components in a current flowing through the winding 20, thereby detecting a mean value of the current flowing through the winding 20. When no DC residual current flows through the two conductors 90, DC components contained in the current flowing through the winding 20 is zero. On the other hand, when a DC residual current flows via grounding (earthing) point of the AC power supply 100 from the DC power supply 201, the DC residual current flows through the conductors 90, thereby generating, according to the residual current, magnetic flux (magnetic field) in the magnetic core 10 through which the conductors 90 are threaded. Magnetic properties of the magnetic core 10 accordingly vary, and the magnetic properties of the magnetic core 10 become magnetizing properties showing asymmetry with respect to the origin as shown in, for example the continuous line of FIG. 2.

Output voltage of the current detector 40 is proportionate to a level of a current flowing through the winding 20. Here, the current flowing through the winding 20 is a total current of an excitation current supplied to the winding 20 from the exciter 30 and a current induced in the winding 20 by the magnetic flux generated in the magnetic core 10. The magnetic flux is generated in the magnetic core 10 according to a current flowing through the conductors 90. The DC component detector 50 attenuates high frequency components contained in the output voltage of the current detector 40, thereby outputting DC components contained in the output voltage of the current detector 40. Output voltage of the DC component detector 50 therefore becomes voltage proportionate to a DC component level contained in a current value detected with the current detector 40. The present embodiment is not required to have an absolute value circuit configured to calculate an absolute value of an output signal of the current detector 40 because the DC component detector 50 attenuates the high frequency components in the output voltage of the current detector 40, thereby detecting DC components contained in the output voltage of the current detector 40.

The discrimination controller 60 is configured to judge whether the output voltage of the DC component detector 50 is higher or lower than the reference voltage. When a DC current flowing through the conductors 90 increases and consequently the output voltage of the DC component detector 50 is greater than the reference voltage, the discrimination controller 60 provides the two contact elements 70 with the charge disable signal. The two contact elements 70 turn off when receiving the charge disable signal, and the shutoff device 1 interrupts the power supply from the AC power supply 100 to the DC power supply 201. Therefore, when a failure such as earth leakage occurs, the shutoff device 1 can interrupt the power supply from the AC power supply 100 to the DC power supply 201. Note that when the output voltage of the DC component detector 50 is less than or equal to the reference voltage, the two contact elements 70 are on because the discrimination controller 60 does not provide the two contact elements 70 with the charge disable signal. In this case, since the shutoff device 1 does not interrupt the power supply from the AC power supply 100 to the DC power supply 201, the DC power supply 201 is supplied with electric power. Note that the shutoff device 1 according to the embodiment is configured so that even when the two contact elements 70 are off, a constant power supply for supplying operating power to the exciter 30, the DC component detector 50, the discrimination controller 60 and the like is configured to acquire electric power from the AC power supply 100 to be activated.

In the shutoff device 1 according to the embodiment, the two contact elements 70 are disposed nearer to the DC power supply 201 than parts of the two conductors 70 electromagnetically coupled to the magnetic core 10, but the location of the two contact elements 70 is no limited thereto. The two contact elements 70 may be disposed nearer to the AC power supply 100 than the parts of the two conductors 90 electromagnetically coupled to the magnetic core 10.

As explained above, the shutoff device 1 according to the present embodiment includes the magnetic core 10, the winding 20, the exciter 30, the current detector 40, the DC component detector 50, the two contact elements 70 and the discrimination controller 60. The magnetic core 10 is electromagnetically coupled to two conductors (in the embodiment, two conductors 90) that allow an AC current to flow through. The winding 20 is wrapped around the magnetic core 10. The exciter 30 is configured to supply the winding 20 with an excitation current that is an alternating current. The current detector 40 is configured to detect a current flowing through the winding 20. The DC component detector 50 is configured to detect a DC component level from the current detected with the current detector 40. The two contact elements 70 are respectively disposed along the two conductors 90. The discrimination controller 60 is configured to turn the two contact elements 70 on when the DC component level detected with the DC component detector 50 is less than or equal to the threshold. The discrimination controller 60 is configured to turn the two contact elements 70 off when the DC component level detected with the DC component detector 50 is greater than the threshold. The discrimination controller 60 is configured to turn the two contact elements 70 off in de-energized condition.

Thus, the magnetic core 10 is electromagnetically coupled to the two conductors that allow an AC current to flow through. In de-energized condition, the two contact elements 70 are off and both the two conductors 90 are interrupted, and therefore a leakage current causing magnetization of the magnetic core 10 hardly flows through the conductors 90 and the magnetic core 10 is hardly magnetized.

In case the DC power supply 201 includes a transformer and primary and secondary sides of the DC power supply 201 are electrically insulated, it is necessary to connect a grounding (earthing) conductor to the primary side of the DC power supply 201 in order to detect ground fault on the primary side of the DC power supply 201. That is, the magnetic core needs to be disposed with the magnetic core magnetically coupled to grounding (earthing) conductors that are respectively connected to two electrically conductive wires connecting the DC power supply 201 and battery 202. That requires additional wiring of the grounding (earthing) conductors and causes time-consuming wiring process. With the shutoff device 1 according to the embodiment in contrast, a path that allows an AC current to flow through is provided with the magnetic core 10. The AC power supply 100 is grounded (earthed) at a distribution board side, and thereby the magnetic core 10 can be arranged with the magnetic core electromagnetically coupled to conductors connecting the AC power supply 100 and the DC power supply 201 (especially, conductors 90 or power cable 300). The magnetic core 10 can therefore be attached easily because no grounding (earthing) conductor needs to be newly installed.

In the shutoff device 1 according to the embodiment, the two contact elements 70 are disposed nearer to the DC power supply 201 than parts, electromagnetically coupled to the magnetic core 10, of the conductors (especially, conductors 90 and power cable 300) that allow an AC current to flow through. The discrimination controller 60 turns the two contact elements 70 off in de-energized condition when the DC power supply 201 is disconnected from the AC power supply 100. No current therefore flows through the parts, electromagnetically coupled to the magnetic core 10, of the conductors 90 from the battery 202 or the like in de-energized condition. Here, when an AC current flows through the conductors 90, the AC current periodically reverses direction thereof, thereby making it difficult to magnetize the magnetic core 10. In contrast, when a DC current flows through the conductors 90, a current continuously flows through the conductors 90 in a constant direction, thereby facilitating magnetizing the magnetic core 10. The magnetic core 10 being magnetized by a DC current may make current detection precision worse. In the present embodiment, the two contact elements 70 are disposed nearer to the DC power supply 201 than the parts of the two conductors 70 electromagnetically coupled to the magnetic core 10. When the two contact elements 70 are off, no residual current flows through the parts of the conductors 90 electromagnetically coupled to the magnetic core 10 even if a ground fault occurs and a residual current flows from the DC power supply 201. The magnetic core 10 is therefore hardly magnetized by a DC residual current.

Embodiment 2

Figure 3:
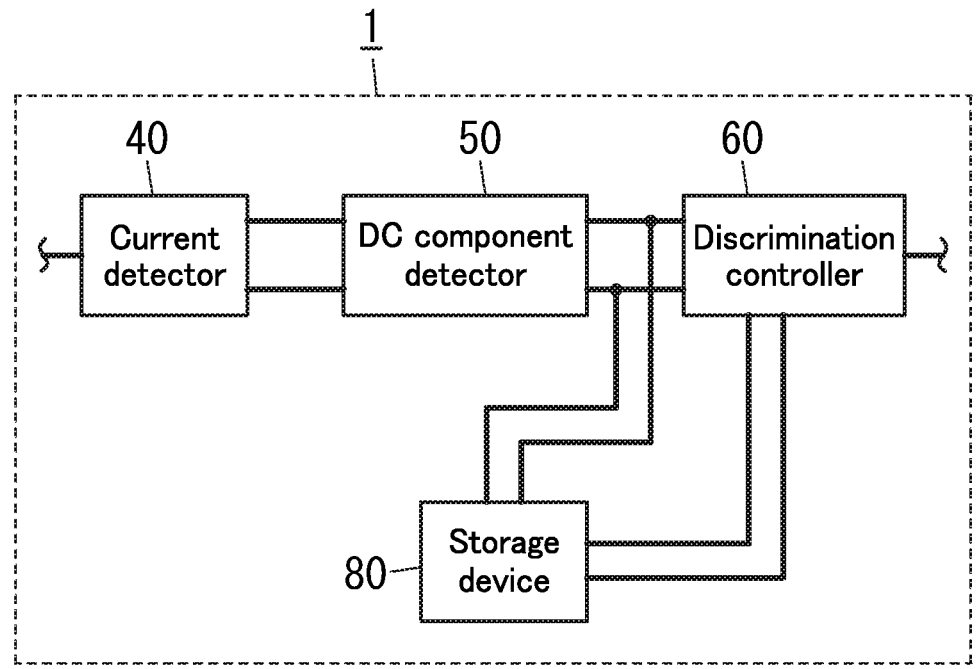
FIG. 3 is a block diagram of part of a shutoff device according to Embodiment 2.

A shutoff device 1 according to Embodiment 2 will be explained with reference to FIG. 3.

A shutoff device 1 according to Embodiment 2 includes a storage device 80 in addition to components of the shutoff device 1 according to Embodiment 1. The storage device 80 is configured to store a DC component level detected with a DC component detector 50 when two contact elements 70 are off. Note that since components except for the storage device 80 are similar to those of the shutoff device 1 according to Embodiment 1, like kind components are assigned the same reference numerals as depicted in Embodiment 1, and are not described herein. The organization in the present embodiment can also be applied to Embodiment 3 to be explained below.

The storage device 80 includes, for example a nonvolatile memory such as EEPROM (Electrically Erasable and Programmable Read Only Memory). The storage device 80 is configured to convert the DC component level detected with the DC component detector 50 into a digital value to be stored in the nonvolatile memory. The storage device 80 also includes a function configured to convert the DC component level stored in the nonvolatile memory into an analog level to be output. Note that the storage device 80 may be a sample hold circuit configured to hold the DC component level detected with the DC component detector 50.

The discrimination controller 60 is configured to store, in the storage device 80, the DC component level detected with the DC component detector 50 (offset value) when the two contact elements 70 are off after sending out a charge disable signal. Herein, the DC component level detected with the DC component detector 50 when the two contact elements 70 are off is proportionate to a level of residual magnetism remaining in the magnetic core 10.

The discrimination controller 60 is configured to then correct the DC component level detected with the DC component detector 50 with the two contact elements 70 being on, based on the DC component level (offset value) stored in the storage device 80. For example, the discrimination controller 60 subtracts, through a subtraction circuit, the DC component level stored in the storage device 80 from the DC component level detected with the DC component detector 50 with the two contact elements 70 being on. The discrimination controller 60 sends out a charge disable signal if a value after the subtraction (correction) is greater than a threshold. That is, when a value obtained by subtracting the offset value from the DC component level detected with the DC component detector 50 is greater than the threshold, the discrimination controller 60 judges that the DC component level detected with the DC component detector 50 is greater than the threshold. DC current detection precision is accordingly improved because the detection error caused by residual magnetism in the magnetic core 10 is corrected based on the DC component level detected with the DC component detector 50 even when the magnetic core 10 is magnetized and residual magnetism occurs in the magnetic core 10.

Figure 4:
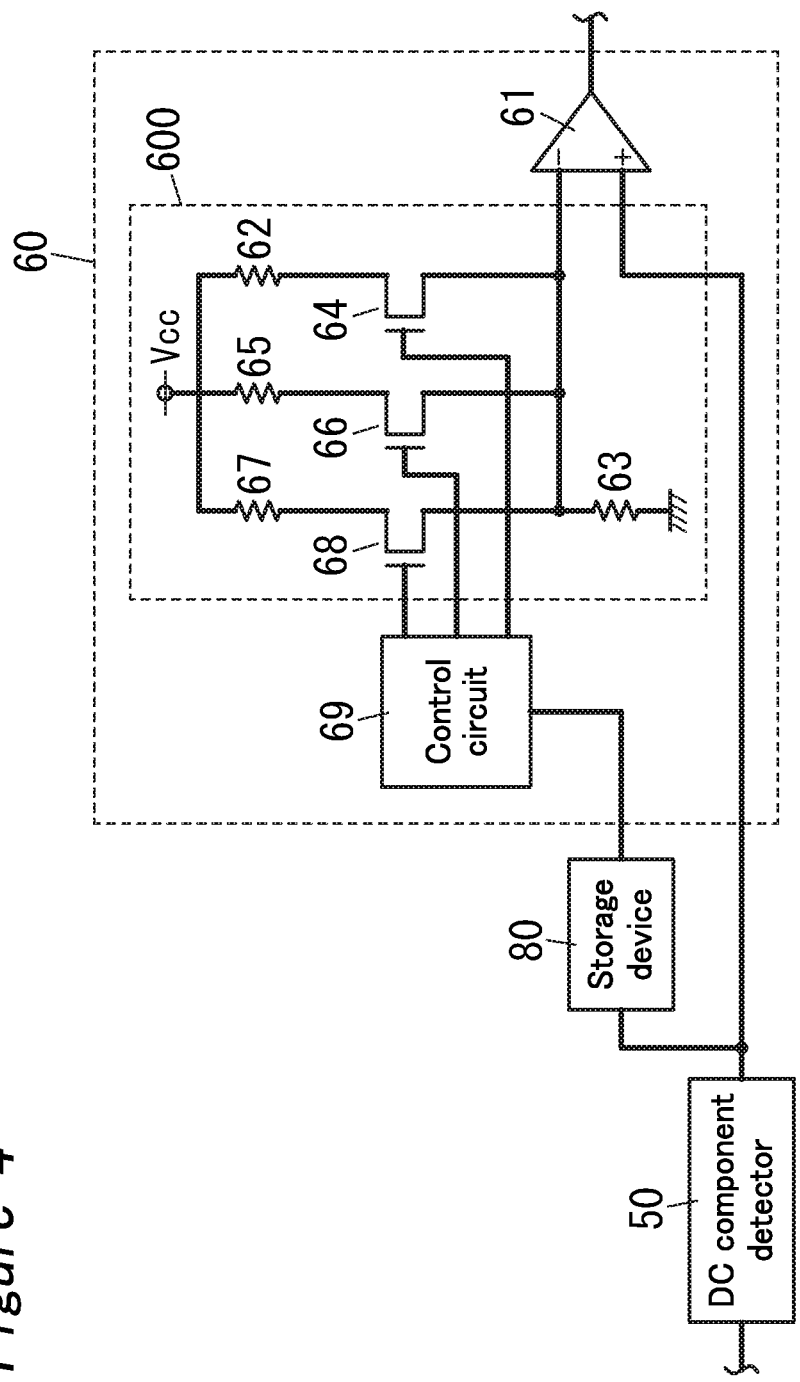
FIG. 4 is a circuit diagram of part of a shutoff device in a modified example of Embodiment 2.

Note that the discrimination controller 60 may correct the threshold based on the DC component level stored in the storage device 80 (offset value). FIG. 4 is a circuit diagram of a modified example in which a discrimination controller 60 is configured to correct a threshold based on a DC component level stored in a storage device 80. The modified example can be applied to Embodiment 3.

The discrimination controller 60 includes a comparator 61, a control circuit 69 and a threshold adjusting circuit 600.

The comparator 61 is configured so that a positive input terminal thereof is provided with output voltage of a DC component detector 50. The comparator 61 is also configured so that a negative input terminal thereof is provided with reference voltage (voltage level as the threshold). The threshold is adjusted through the threshold adjusting circuit 600.

The threshold adjusting circuit 600 includes resistors 62, 63, 65 and 67, and semiconductor switches 64, 66 and 68 such as MOSFETs. Note that the semiconductor switches 64, 66 and 68 are not limited to the MOSFETs, but may be semiconductor switches such as bipolar transistors.

A first end of the resistor 63 is connected to circuit ground (earth), while a second end of the resistor 63 is connected to respective first ends of the semiconductor switches 64, 66 and 68. A second end of the semiconductor switch 64 is connected to a first end of the resistor 62. A second end of the resistor 62 is connected to a constant power supply configured to output constant power supply voltage Vcc. A second end of the semiconductor switch 66 is connected to a first end of the resistor 65. A second end of the resistor 65 is connected to the constant power supply. A second end of the semiconductor switch 68 is connected to a first end of the resistor 67. A second end of the resistor 67 is connected to the constant power supply. Here, respective control terminals of the semiconductor switches 64, 66 and 68 are individually connected to output terminals of the control circuit 69. The control terminal of the semiconductor switch 64 is supplied with a control signal from the control circuit 69, and then the semiconductor switch 64 turns on. The control terminal of the semiconductor switch 64 is not supplied with the control signal, and then the semiconductor switch 64 turns off. Respective operations of the semiconductor switches 66 and 68 are similar to the operation of the semiconductor switch 64. The control terminals of the semiconductor switches 66 and 68 are supplied with control signals from the control circuit 69, and then the semiconductor switches 66 and 68 turn on.

Thus, the discrimination controller 60 has a voltage divider circuit composed of the resistors 62, 63, 65 and 67, and is configured to adjust the threshold based on voltage obtained by dividing the constant voltage Vcc by the voltage divider circuit. The resistors 62, 63, 65 and 67 include one or more adjustment resistors 62, 65 and 67. The voltage divider circuit further includes one or more semiconductor switches 64, 66 and 68 that are individually connected to the one or more adjustment resistors 62, 65 and 67. The discrimination controller 60 is configured to vary a division ratio of the voltage divider circuit by individually turning the one or more semiconductor switches 64, 66 and 68 on or off according to the offset value.

Herein, the resistors 62, 65 and 67 of the resistors 62, 63, 65 and 67 constituting the voltage divider circuit are the adjustment resistors, and the resistors 62, 65 and 67 are respectively connected to the semiconductor switches 64, 66 and 68. Note that the resistors constituting the voltage divider circuit are required to include at least one resistor as the adjustment resistor, and all the resistors constituting the voltage divider circuit may be provided as the adjustment resistors.

When only the semiconductor switch 64 is turned on, a voltage level of the threshold becomes a voltage level obtained by dividing the constant voltage Vcc from the constant power supply by the resistors 62 and 63.

When the semiconductor switches 64 and 66 are turned on, the resistors 62 and 65 are connected in parallel. In this case, a voltage level of the threshold becomes a voltage level obtained by dividing the voltage Vcc by the resistor 63 and a parallel circuit of the resistors 62 and 65, and therefore higher than that of the threshold when only the semiconductor switch 64 is turned on.

When the semiconductor switches 64, 66 and 68 are turned on, the resistors 62, 65 and 67 are connected in parallel. In this case, a voltage level of the threshold becomes a voltage level obtained by dividing the voltage Vcc by the resistor 63 and a parallel circuit of the resistors 62, 65 and 67, and therefore further higher than that of the threshold when the semiconductor switches 64 and 66 are turned on.

The control circuit 69 is configured to turn the semiconductor switches 64, 66 and 68 on or off according to the DC component level stored in the storage device 80 (offset value). The control circuit 69 compares the DC component level stored in the storage device 80 with a first reference level and a second reference level. Here, the second reference level is set to be a voltage level higher than the first reference level.

When the DC component level stored in the storage device 80 is lower than the first reference level, the control circuit 69 provides a control signal to only the control terminal of the semiconductor switch 64, thereby turning only the semiconductor switch 64 on. The control circuit 69 adjusts a voltage level of the threshold to the voltage level obtained by dividing the constant voltage Vcc by the resistors 62 and 63.

When the DC component level stored in the storage device 80 is greater than or equal to the first reference level and less than the second reference level, the control circuit 69 turns the semiconductor switches 64 and 66 on. The control circuit 69 adjusts a voltage level of the threshold to the voltage level obtained by dividing the constant voltage Vcc by the resistor 63 and the parallel circuit of the resistors 62 and 65. The voltage level of the threshold accordingly becomes higher than that when only the semiconductor switch 64 is turned on, thereby making it difficult for errors in detection to occur even when the magnetic core 10 is magnetized and the output level of the DC component detector 50 increases.

When the DC component level stored in the storage device 80 is greater than or equal to the second reference level, the control circuit 69 turns the semiconductor switches 64, 66 and 68 on. The control circuit 69 adjusts a voltage level of the threshold to the voltage level obtained by dividing the constant voltage Vcc by the resistor 63 and the parallel circuit of the resistors 62, 65 and 67. That is, the discrimination controller 60 is configured to increase the threshold with an increase in the offset value. A voltage level of the threshold accordingly becomes further higher than that when the semiconductor switches 64 and 66 are on, thereby making it difficult for errors in detection to occur even when the magnetic core 10 is magnetized and the output level of the DC component detector 50 increases.

As explained above, the shutoff device 1 according to the present embodiment may further include the storage device 80 configured to store the DC component level detected with the DC component detector 50 when the two contact elements 70 are off. The discrimination controller 60 is configured to correct either the threshold or the DC component level detected with the DC component detector 50 when the two contact elements 70 are on, based on the DC component level stored in the storage device 80.

Even when the magnetic core 10 is magnetized and an offset value occurs in the output signal of the DC component detector 50 when the two contact elements 70 are off, the offset value can be stored in the storage device 80. Based on the offset value stored in the storage device 80, the discrimination controller 60 then corrects either the threshold or the DC component level detected with the DC component detector 50 when the two contact elements 70 are on. Therefore, malfunction hardly occurs in the discrimination controller 60 even when errors occur in detection of the DC component detector 50 as a result of the magnetic core 10 being magnetized.

The shutoff device 1 stores, in the storage device 80, the DC component level detected with the DC component detector 50 when the two contact elements 70 are off, namely when the DC power supply 201 is disconnected from the AC power supply 100. Though the storage device 80 stores the DC component level detected with the DC component detector 50 when the shutoff device 1 is deactivated and subsequently activated, the operation can be completed within the starting-time. Therefore, additional waiting time while the storage device 80 performs a storing operation is not unnecessary (for users).

The discrimination controller 60 may be configured to adjust the threshold according to the DC component level stored in the storage device 80 through a circuit including resistors and semiconductor switches (threshold adjusting circuit 600).

The discrimination controller 60 adjusts the threshold according to the DC component level stored in the storage device 80, and therefore malfunction hardly occurs in the discrimination controller 60 even when errors occur in detection of the DC component detector 50 as a result of the magnetic core 10 being magnetized. The circuit for adjusting the threshold is composed of the resistors (resistors 62, 63, 65 and 67) and the semiconductor switches (semiconductor switches 64, 66 and 68), and can therefore be miniaturized and improve durability thereof as compared with cases where mechanical switches are provided.

In the present embodiment, the circuit for adjusting the threshold (threshold adjusting circuit 600) is composed of the voltage divider circuit with the resistors. Part or all of the resistors are connected with one or more semiconductor switches (in parallel or series). The discrimination controller 60 is required to turn the one or more semiconductor switches on or off to vary a division ratio of the voltage divider circuit, thereby adjusting the threshold.

Embodiment 3

Figure 5:
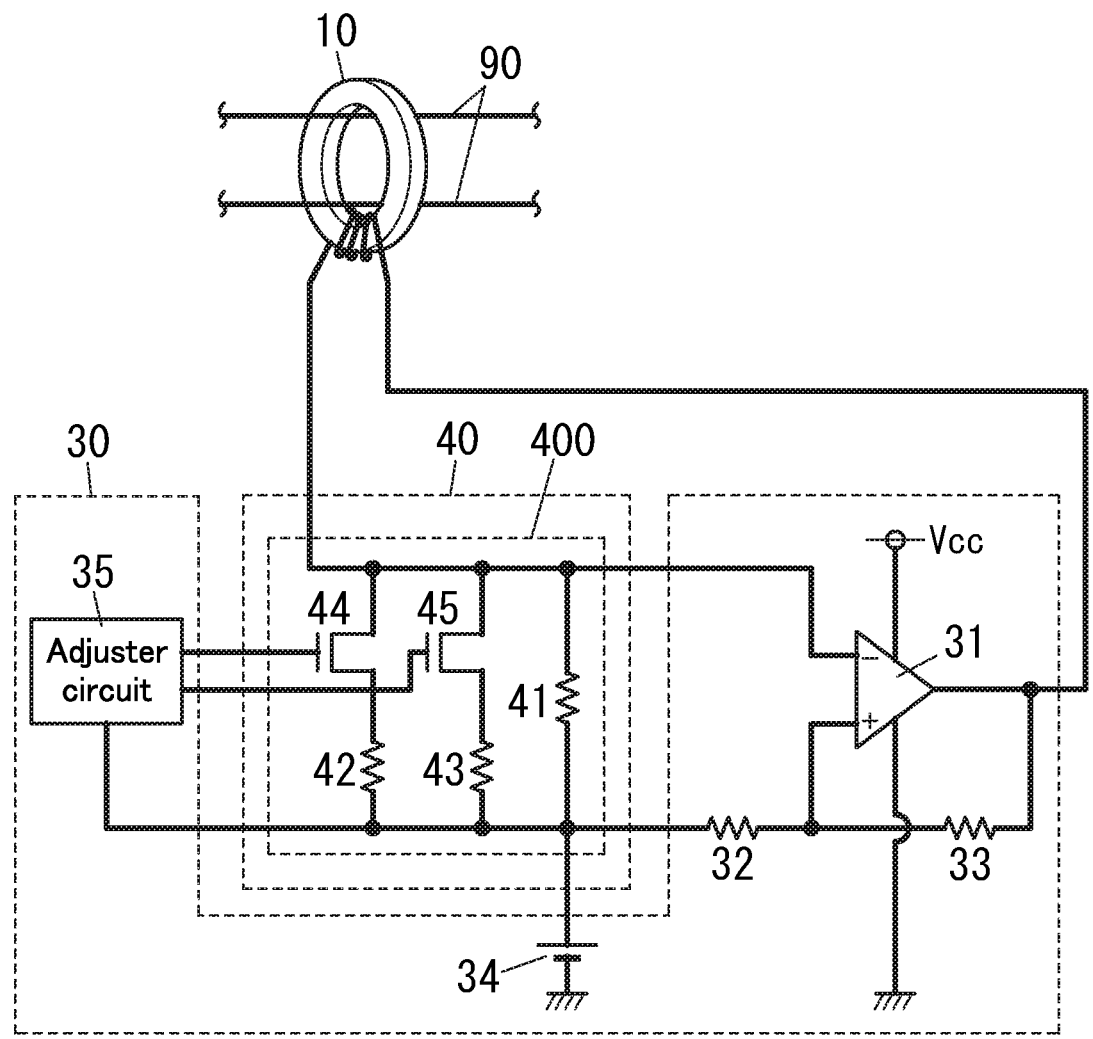
FIG. 5 is a circuit diagram of part of a shutoff device according to Embodiment 3.

A shutoff device 1 according to Embodiment 3 will be explained with reference to FIG. 5.

In the shutoff device 1 according to Embodiment 3, a current detector 40 corresponding to the shutoff device 1 explained in Embodiment 1 further includes an impedance circuit 400. The impedance circuit 400 is configured to produce a voltage signal that is proportionate to a level of a current flowing through a winding 20. An exciter 30 is configured to supply the winding 20 with an excitation current whose amplitude varies according to a level of the voltage signal produced through the impedance circuit 400. The exciter 30 has an adjuster circuit 35 configured to adjust an impedance value of the impedance circuit 400. Here, when output voltage of the exciter 30 is constant, the amplitude of the excitation current supplied to the winding 20 decreases with an increase in the impedance value of the impedance circuit 400. Note that the configuration except for the impedance circuit 400 and the adjuster circuit 35 is similar to that of Embodiment 1, and therefore like kind components are assigned the same reference numerals as depicted in Embodiment 1, and are not described herein.

The impedance circuit 400 has resistors 41, 42 and 43, and semiconductor switches 44 and 45. A first end of the resistor 41 is connected to the winding 20, while a second end of the resistor 41 is connected to a constant power supply 34. A series circuit of the semiconductor switch 44 such as a MOSFET and the resistor 42 is connected across the resistor 41. A series circuit of the semiconductor switch 45 such as a MOSFET and the resistor 43 is also connected across the resistor 41. Respective control terminals of the semiconductor switches 44 and 45 are connected with the adjuster circuit 35. The control terminal of the semiconductor switch 44 is provided with a control signal from the adjuster circuit 35, and then the semiconductor switch 44 turns on. The control terminal of the semiconductor switch 44 is not provided with the control signal from the adjuster circuit 35, and then the semiconductor switch 44 turns off. An operation of the semiconductor switch 45 is similar to that of the semiconductor switch 44, and therefore not described herein. Note that the semiconductor switches 44 and 45 are not limited to the MOSFETs, but may be semiconductor switches such as bipolar transistors.

Thus, the impedance circuit 400 has the resistors 41, 42 and 43 connected in parallel. The resistors 41, 42 and 43 include one or more adjustment resistors 42 and 43. The impedance circuit 400 further has one or more semiconductor switches 44 and 45 that are individually connected to the one or more adjustment resistors 42 and 43 in series. The adjuster circuit 35 is configured to individually turn the one or more semiconductor switches 44 and 45 on or off, thereby adjusting the impedance value of the impedance circuit 400.

Herein, the resistors 42 and 43 of the three resistors 41, 42 and 43 included in the impedance circuit 400 are adjustment resistors, and respectively connected with the semiconductor switches 44 and 45. Note that the resistors included in the impedance circuit 400 are required to include at least one resistor as the adjustment resistor, and all the resistors included in the impedance circuit 400 may be provided as the adjustment resistors.

When the adjuster circuit 35 turns the semiconductor switches 44 and 45 off, only the resistor 41 functions in the impedance circuit 400, and an impedance value of the impedance circuit 400 is adjusted to the maximum. When the impedance value of the impedance circuit 400 is adjusted to the maximum, a current flowing through the impedance circuit 400 and an excitation current supplied to the winding 20 from the exciter 30 are adjusted to minima.

When the adjuster circuit 35 turns the semiconductor switches 44 and 45 on and off, respectively, a parallel circuit of the resistors 41 and 42 functions in the impedance circuit 400. An impedance value of the impedance circuit 400 accordingly decreases as compared with cases where the semiconductor switches 44 and 45 are off, and therefore the current flowing through the impedance circuit 400 and the excitation current supplied to the winding 20 from the exciter 30 increase.

When the adjuster circuit 35 turns the semiconductor switches 44 and 45 on, a parallel circuit of the resistors 41, 42 and 43 functions in the impedance circuit 400. In this case, the impedance value of the impedance circuit 400 further decreases as compared with cases where the semiconductor switches 44 and 45 are respectively on and off, the current flowing through the impedance circuit 400 increases, and therefore the excitation current supplied to the winding 20 from the exciter 30 is adjusted to the maximum. Here, the amplitude of the excitation current supplied to the winding 20 from the exciter 30 is adjusted to amplitude for sufficiently magnetically saturating the magnetic core 10.

Herein, the amplitude of the excitation current when the semiconductor switches 44 and 45 are on is amplitude enough to magnetically saturate the magnetic core 10, and called first amplitude. The amplitude of the excitation current when the semiconductor switches 44 and 45 are off is smaller than the first amplitude, and called second amplitude. That is, the first amplitude is amplitude for demagnetizing the magnetic core 10, and the second amplitude is smaller than the first amplitude.

In a normal operation condition, the adjuster circuit 35 turns the semiconductor switches 44 and 45 off so that the exciter 30 operates at the second amplitude for adjusting the excitation current supplied to the winding 20 to the minimum. The second amplitude is amplitude for barely magnetically saturating the magnetic core 10.

When the discrimination controller 60 detects a residual current and then turns the two contact elements 70 off, the adjuster circuit 35 turns the semiconductor switches 44 and 45 on, thereby adjusting the amplitude of the excitation current supplied to the winding 20 from the exciter 30 to the maximum. At this moment, the magnetic core 10 is magnetically saturated by magnetic flux generated around the winding 20, thereby starting removing residual magnetism of the magnetic core 10.

The adjuster circuit 35 then respectively turns the semiconductor switches 44 and 45 on and off to stepwise decrease the excitation current supplied to the winding 20 from the exciter 30, and subsequently turn all the semiconductor switches 44 and 45 off. Accordingly, the excitation current supplied to the winding 20 from the exciter 30 is adjusted to the minimum and demagnetization operation is concluded. In this state, the exciter 30 stops supplying the excitation current to the winding 20, and can thereby decrease residual magnetism in the magnetic core 10 because the amplitude of the excitation current is adjusted to the minimum.

That is, the adjuster circuit 35 is configured to, when the two contact elements 70 are off, adjust the amplitude of the excitation current to the first amplitude that is greater than reference amplitude for demagnetizing the magnetic core 10, and subsequently vary the impedance value of the impedance circuit 400 so that the amplitude of the excitation current becomes the second amplitude that is less than the reference amplitude.

The shutoff device 1 according to the present embodiment can accordingly reduce the influence of residual magnetism generated in the magnetic core 10 as a result of the magnetic core 10 being magnetized, and improve detection precision of a DC current. The detection precision of a DC current is improved, thereby making it difficult for malfunction to occur in the discrimination controller 60.

As stated above, in the shutoff device 1 according to the embodiment, the current detector 40 includes the impedance circuit 400 configured to produce a voltage signal whose level is proportionate to a level of a current flowing through the winding 20. The exciter 30 is configured to supply the winding 20 with an excitation current whose amplitude varies according to the level of the voltage signal produced through the impedance circuit 400. The exciter 30 has the adjuster circuit 35 configured to adjust the impedance value of the impedance circuit 400.

Thus, the adjuster circuit 35 adjusts the impedance value of the impedance circuit 400, and can thereby vary the excitation current supplied to the winding 20 from the exciter 30.

The adjuster circuit 35 may adjust the impedance value of the impedance circuit 400 with the resistors (41, 42 and 43) and the semiconductor switches (semiconductor switches 44 and 45) in the impedance circuit 400.

The adjuster circuit 35 adjusts the impedance value of the impedance circuit 400 with the resistors and the semiconductor switches, thereby varying the amplitude of the excitation current. It is therefore possible to simplify the circuit configuration and miniaturize the shutoff device 1 as compared with cases where the circuit for varying the amplitude of the excitation current is composed of an amplifier. The impedance circuit 400 also has the semiconductor switches and can therefore improve durability thereof and be miniaturized as compared with cases where mechanical switches are provided.

Note that the impedance circuit 400 has the resistors connected in series or parallel and one or more semiconductor switches connected to part or all of the resistors (in parallel or series). The adjuster circuit 35 individually turns the one or more semiconductor switches of the impedance circuit 400 on or off, thereby varying the impedance value of the impedance circuit 400.

In the shutoff device 1 according to the present embodiment, the adjuster circuit 35 may vary the impedance value so that when the two contact elements 70 are off, the amplitude of the excitation current supplied to the winding 20 is adjusted to the first amplitude and subsequently to the second amplitude. Here, the first amplitude is amplitude for demagnetizing the magnetic core 10, and the second amplitude is smaller than the first amplitude.

Thus, when the two contact elements 70 are off, the adjuster circuit 35 varies the amplitude of the excitation current supplied to the winding 20 from the first amplitude to the second amplitude, and therefore the residual magnetism remaining in the magnetic core 10 as a result of the magnetic core 10 being magnetized can be reduced. Since the shutoff device 1 according to the embodiment can reduce the residual magnetism in the magnetic core 10, malfunction hardly occurs in the shutoff device 1.

The organization of this embodiment can be applied to the shutoff device 1 according to Embodiment 2. Note that the organization of Embodiment 2 may be applied as required, and is not indispensable to the shutoff device 1 according to Embodiment 3.

In the abovementioned embodiments, the magnetic core 10 is in the shape of the circular ring and the hole of the magnetic core 10 allows the conductors 90 to be threaded through, but the shape and arrangement of the magnetic core 10 are not limited to the embodiments. The magnetic core 10 may be in the shape of a rectangular frame or a rod as long as the magnetic core 10 is electromagnetically coupled to the conductors 90 so that respective magnetic flux generated around the conductors 90 by a current flowing through the conductors 90 flows in the magnetic core.

As can be seen from the abovementioned embodiments, a shutoff device (1) according to a first aspect of the present invention includes a magnetic core (10), a winding (20), an exciter (30), a current detector (40), a DC component detector (50), two contact elements (70) and a discrimination controller (60). The magnetic core (10) is electromagnetically coupled to two conductors (90) that allow an AC current to flow through. The winding (20) is wrapped around the magnetic core (10). The exciter (30) is configured to supply the winding (20) with an excitation current that is an alternating current. The current detector (40) is configured to detect a current flowing through the winding (20). The DC component detector (50) is configured to detect a DC component level from the current detected with the current detector (40). The two contact elements (70) are respectively disposed along the two conductors (90). The discrimination controller (60) is configured to turn the two contact elements (70) on when the DC component level detected with the DC component detector (50) is less than or equal to a threshold. The discrimination controller (60) is configured to turn the two contact elements (70) off when the DC component level detected with the DC component detector (50) is greater than the threshold. The discrimination controller (60) is configured to turn the two contact elements off in de-energized condition.

The shutoff device (1) according to the first aspect further includes a storage device (80) as a second aspect of the present invention. The storage device (80) is configured to store, as an offset value, the DC component level detected with the DC component detector (50) when the two contact elements (70) are off. Herein, the discrimination controller (60) is configured to judge that the DC component level detected with the DC component detector (50) is greater than the threshold, when a value obtained by subtracting the offset value from the DC component level detected with the DC component detector is greater than the threshold.

The shutoff device (1) according to the first aspect further includes a storage device (80) as a third aspect of the present invention. The storage device (80) is configured to store, as an offset value, the DC component level detected with the DC component detector (50) when the two contact elements (70) are off. Herein, the discrimination controller (60) is configured to increase the threshold with an increase in the offset value.

In the shutoff device (1) according to the third aspect, as a fourth aspect of the present invention, the discrimination controller (60) has a voltage divider circuit composed of resistors (62, 63, 65 and 67), and is configured to adjust the threshold based on voltage obtained by dividing constant voltage (Vcc) by the voltage divider circuit. The resistors (62, 63, 65 and 67) includes at least one adjustment resistor (62, 65, 67). The voltage divider circuit further includes at least one semiconductor switch (64, 66, 68) individually connected to said at least one adjustment resistor (62, 65, 67). Herein, the discrimination controller (60) is configured to individually turn said at least one semiconductor switch (64, 66, 68) on or off according to the offset value, thereby varying a division ratio of the voltage divider.

In a shutoff device (1) according to any one of the first to fourth aspects, as a fifth aspect of the present invention, the current detector (40) includes an impedance circuit (400) that is configured to produce a voltage signal whose level is proportionate to a level of a current flowing through the winding (20). Herein, the exciter (30) is configured to supply the winding (20) with the excitation current whose amplitude varies according to the level of the voltage signal produced through the impedance circuit (400). The exciter also has an adjuster circuit (35) that is configured to adjust an impedance value of the impedance circuit (400).

In the shutoff device (1) according to the fifth aspect, as a sixth aspect of the present invention, the impedance circuit (400) includes resistors (41, 42 and 43) connected in parallel. The resistors (41, 42 and 43) includes at least one adjustment resistor (42, 43). The impedance circuit (400)

further includes at least one semiconductor switch (44, 45) individually connected in series to said at least one adjustment resistor (42, 43). The adjuster circuit (35) is configured to individually turn said at least one semiconductor switch (44, 45) on or off, thereby adjusting the impedance value of the impedance circuit (400).

In a shutoff device (1) according to a fifth or sixth aspect, as a seventh aspect of the present invention, the adjuster circuit (35) is configured to, when the two contact elements (70) are off, adjust the amplitude of the excitation current to first amplitude for demagnetizing the magnetic core (10), and subsequently vary the impedance value of the impedance circuit (400) so as to adjust the amplitude of the excitation current to second amplitude smaller than the first amplitude.

REFERENCE SIGNS LIST

1 Shutoff device
10 Magnetic core
20 Winding
30 Exciter
35 Adjuster circuit
40 Current detector
41, 42, 43 resistor
44, 45 semiconductor switch
50 DC component detector
60 Discrimination controller
62, 63, 65, 67 resistor
64, 66, 68 semiconductor switch
69 Control circuit
70 contact element (two contact elements)
80 Storage device
90 Conductor
100 AC power supply
201 DC power supply
400 Impedance circuit
600 Threshold adjusting circuit

The invention claimed is:

1. A shutoff device configured to be connected to an AC power supply through a first power cable, the shutoff device configured to be connected to an electric drive vehicle through a second power cable, wherein the first power cable is electrically connected to the second power cable through two conductors, the shutoff device comprising:
    a magnetic core that is electromagnetically coupled to the two conductors that allow an AC current to flow through,
    a winding that is wrapped around the magnetic core,
    an exciter that is configured to supply the winding with an excitation current that is an alternating current,
    a current detector that is configured to detect a current flowing through the winding,
    a DC component detector that is configured to detect a DC component level from the current detected with the current detector,
    two contact elements that are respectively disposed along the two conductors, and
    a discrimination controller that is configured to:
        not provide the two contact elements with a charge disable signal to turn the two contact elements on when the DC component level detected with the DC component detector is less than or equal to a threshold;
        provide the two contact elements with the charge disable signal to turn the two contact elements off when the DC component level detected with the DC component detector is greater than the threshold; and
        provide the two contact elements with the charge disable signal to turn the two contact elements off according to a signal indicating a de-energized condition in which the electric drive vehicle is electrically disconnected from the AC power supply.

2. The shutoff device of claim 1, further comprising a storage device that is configured to store, as an offset value, the DC component level detected with the DC component detector when the two contact elements are off, wherein
    the discrimination controller is configured to judge that the DC component level detected with the DC component detector is greater than the threshold, when a value obtained by subtracting the offset value from the DC component level detected with the DC component detector.

3. The shutoff device of claim 1, further comprising a storage device that is configured to store, as an offset value, the DC component level detected with the DC component detector when the two contact elements are off, wherein
    the discrimination controller is configured to increase the threshold with an increase in the offset value.

4. The shutoff device of claim 3, wherein
    the discrimination controller has a voltage divider circuit composed of resistors, and is configured to adjust the threshold based on voltage obtained by dividing constant voltage by the voltage divider circuit,
    the resistors including at least one adjustment resistor,
    the voltage divider circuit further includes at least one semiconductor switch individually connected to said at least one adjustment resistor, and
    the discrimination controller is configured to individually turn said at least one semiconductor switch on or off according to the offset value, thereby varying a division ratio of the voltage divider.

5. The shutoff device of claim 1, wherein
    the current detector comprises an impedance circuit that is configured to produce a voltage signal whose level is proportionate to a level of a current flowing through the winding, and
    the exciter is configured to supply the winding with the excitation current whose amplitude varies according to the level of the voltage signal produced through the impedance circuit, the exciter having an adjuster circuit that is configured to adjust an impedance value of the impedance circuit.

6. The shutoff device of claim 5, wherein
    the impedance circuit includes resistors connected in parallel, the resistors including at least one adjustment resistor, the impedance circuit further including at least one semiconductor switch individually connected in series to said at least one adjustment resistor, and
    the adjuster circuit is configured to individually turn said at least one semiconductor switch of the impedance circuit on or off, thereby adjusting the impedance value of the impedance circuit.

7. The shutoff device of claim 5, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

8. The shutoff device of claim 2, wherein
the current detector comprises an impedance circuit that is configured to produce a voltage signal whose level is proportionate to a level of a current flowing through the winding, and
the exciter is configured to supply the winding with the excitation current whose amplitude varies according to the level of the voltage signal produced through the impedance circuit, the exciter having an adjuster circuit that is configured to adjust an impedance value of the impedance circuit.

9. The shutoff device of claim 3, wherein
the current detector comprises an impedance circuit that is configured to produce a voltage signal whose level is proportionate to a level of a current flowing through the winding, and
the exciter is configured to supply the winding with the excitation current whose amplitude varies according to the level of the voltage signal produced through the impedance circuit, the exciter having an adjuster circuit that is configured to adjust an impedance value of the impedance circuit.

10. The shutoff device of claim 4, wherein
the current detector comprises an impedance circuit that is configured to produce a voltage signal whose level is proportionate to a level of a current flowing through the winding, and
the exciter is configured to supply the winding with the excitation current whose amplitude varies according to the level of the voltage signal produced through the impedance circuit, the exciter having an adjuster circuit that is configured to adjust an impedance value of the impedance circuit.

11. The shutoff device of claim 8, wherein
the impedance circuit includes resistors connected in parallel, the resistors including at least one adjustment resistor, the impedance circuit further including at least one semiconductor switch individually connected in series to said at least one adjustment resistor, and
the adjuster circuit is configured to individually turn said at least one semiconductor switch of the impedance circuit on or off, thereby adjusting the impedance value of the impedance circuit.

12. The shutoff device of claim 9, wherein
the impedance circuit includes resistors connected in parallel, the resistors including at least one adjustment resistor, the impedance circuit further including at least one semiconductor switch individually connected in series to said at least one adjustment resistor, and
the adjuster circuit is configured to individually turn said at least one semiconductor switch of the impedance circuit on or off, thereby adjusting the impedance value of the impedance circuit.

13. The shutoff device of claim 10, wherein
the impedance circuit includes resistors connected in parallel, the resistors including at least one adjustment resistor, the impedance circuit further including at least one semiconductor switch individually connected in series to said at least one adjustment resistor, and
the adjuster circuit is configured to individually turn said at least one semiconductor switch of the impedance circuit on or off, thereby adjusting the impedance value of the impedance circuit.

14. The shutoff device of claim 6, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

15. The shutoff device of claim 8, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

16. The shutoff device of claim 9, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

17. The shutoff device of claim 10, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

18. The shutoff device of claim 11, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

19. The shutoff device of claim 12, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

20. The shutoff device of claim 13, wherein the adjuster circuit is configured to, when the two contact elements are off, adjust the amplitude of the excitation current to first amplitude for demagnetizing the magnetic core, and subsequently vary the impedance value of the impedance circuit so as to adjust the amplitude of the excitation current to second amplitude smaller than the first amplitude.

* * * * *